(12) United States Patent
Yorikado et al.

(10) Patent No.: US 10,283,544 B2
(45) Date of Patent: May 7, 2019

(54) SOLID-STATE IMAGING ELEMENT AND IMAGING DEVICE

(71) Applicant: SONY SEMICONDUCTOR SOLUTIONS CORPORATION, Kanagawa (JP)

(72) Inventors: Yuhi Yorikado, Kanagawa (JP); Atsushi Toda, Kanagawa (JP); Susumu Inoue, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/746,054

(22) PCT Filed: Oct. 14, 2016

(86) PCT No.: PCT/JP2016/080501
§ 371 (c)(1),
(2) Date: Jan. 19, 2018

(87) PCT Pub. No.: WO2017/094362
PCT Pub. Date: Jun. 8, 2017

(65) Prior Publication Data
US 2018/0211990 A1    Jul. 26, 2018

(30) Foreign Application Priority Data

Dec. 3, 2015  (JP) ................................. 2015-236329

(51) Int. Cl.
*H01L 27/14*  (2006.01)
*H01L 27/146*  (2006.01)
(Continued)

(52) U.S. Cl.
CPC ......... *H01L 27/14627* (2013.01); *G02B 3/00* (2013.01); *H01L 27/14* (2013.01);
(Continued)

(58) Field of Classification Search
CPC ........................................................ H01L 27/14
See application file for complete search history.

(56) References Cited

U.S. PATENT DOCUMENTS 5,138,415 A * 8/1992 Yano ................... H01L 27/1443
257/113
2010/0127652 A1* 5/2010 Morita ................ H01L 29/7787
318/400.27
(Continued)

FOREIGN PATENT DOCUMENTS

JP   H07-161953   6/1995
JP   H09-64324    3/1997
(Continued)

OTHER PUBLICATIONS

International Search Report prepared by the Japan Patent Office dated Dec. 15, 2016, for International Application No. PCT/JP2016/080501.

*Primary Examiner* — Caridad Everhart
*Assistant Examiner* — Ankush K Singal
(74) *Attorney, Agent, or Firm* — Sheridan Ross P.C.

(57) ABSTRACT

To improve detection efficiency in a solid-state imaging element including a SPAD in which an electrode and wiring are placed in a central portion.

A solid-state imaging element includes a photodiode and a light collecting section. The photodiode includes a light receiving surface and an electrode placed on the light receiving surface, and that outputs an electrical signal in accordance with light incident on the light receiving surface in a state where a voltage exceeding a breakdown voltage is applied to the electrode. The light collecting section causes light from a subject to be collected in the light receiving surface other than a region where the electrode is placed.

11 Claims, 15 Drawing Sheets

(51) Int. Cl.
    *G02B 3/00*         (2006.01)
    *H01L 31/107*      (2006.01)
    *H04N 5/374*       (2011.01)
    *H04N 5/359*       (2011.01)
    *H01L 31/0224*     (2006.01)
    *H01L 31/0232*     (2014.01)

(52) U.S. Cl.
    CPC ...... *H01L 27/146* (2013.01); *H01L 27/14603* (2013.01); *H01L 27/14629* (2013.01); *H01L 31/02327* (2013.01); *H01L 31/022408* (2013.01); *H01L 31/107* (2013.01); *H04N 5/359* (2013.01); *H04N 5/374* (2013.01)

(56) References Cited

U.S. PATENT DOCUMENTS

| | | | |
|---|---|---|---|
| 2010/0271108 A1* | 10/2010 | Sanfilippo | H01L 31/107 327/502 |
| 2012/0025340 A1 | 2/2012 | Park | |
| 2015/0200222 A1* | 7/2015 | Webster | H01L 31/107 250/208.1 |
| 2017/0131143 A1* | 5/2017 | Andreou | G01J 1/44 |

FOREIGN PATENT DOCUMENTS

| | | |
|---|---|---|
| JP | 2011-159972 | 8/2011 |
| JP | 2013-143431 | 7/2013 |
| JP | 2015-167219 | 9/2015 |

\* cited by examiner a b a b c

SOLID-STATE IMAGING ELEMENT AND IMAGING DEVICE

CROSS REFERENCE TO RELATED APPLICATIONS

This application is a national stage application under 35 U.S.C. 371 and claims the benefit of PCT Application No. PCT/JP2016/080501 having an international filing date of 14 Oct. 2016, which designated the United States, which PCT application claimed the benefit of Japan Patent Application No. 2015-236329 filed 3 Dec. 2015, the disclosure of each of which are incorporated herein by reference.

TECHNICAL FIELD

The present technology relates to a solid-state imaging element and an imaging device. Specifically, the present technology relates to a solid-state imaging element and an imaging device using a single-photon avalanche photodiode.

BACKGROUND ART

Thus far, an imaging device in which a single-photon avalanche diode (SPAD) is used as a photoelectric conversion element of a pixel has been used as an imaging device used for imaging or the measurement of the distance to a subject in a low-illuminance environment. The SPAD is a photodiode that performs photoelectric conversion in a state where a voltage exceeding the breakdown voltage is applied. Since a voltage exceeding the breakdown voltage has been applied, an electron avalanche derived from a carrier generated by photoelectric conversion occurs, and the SPAD enters a breakdown state. As a result, multiplication of carriers based on the photoelectric conversion is made, and an improvement in sensitivity in the imaging device is expected. However, since a relatively high voltage is applied to the SPAD, the SPAD requires a relatively large isolation region for being isolated from the surrounding circuits etc. Further, an electrode of the SPAD and wiring connected to the electrode are placed on a surface of the pixel. The region where the SPAD is formed corresponds to a light receiving surface in the surface of the pixel; therefore, by the isolation region etc. described above being placed, the ratio of the light receiving surface in the pixel surface, that is, the aperture ratio is reduced. Hence, photon detection efficiency is a relatively low value. Here, the detection efficiency is the ratio of the number of detected photons to the number of incident photons, and is a value showing characteristics of photon detection.

Thus, an imaging device in which light incident on an isolation region is guided to a SPAD and thereby detection efficiency is improved is used. For example, an imaging device in which a microlens is placed for each pixel and light is collected to a region of a SPAD that is formed in a central portion of the pixel is proposed (for example, see Patent Literature 1).

CITATION LIST

Patent Literature

Patent Literature 1: JP 2008-103614A

DISCLOSURE OF INVENTION

Technical Problem

In the conventional technology described above, electrodes are placed in an end portion of a SPAD and incident light is collected to a central portion of the SPAD, and thereby detection efficiency is improved. However, since electrodes are placed in an end portion of the SPAD, the electric field between the electrodes is unequal, and electric fields concentrate in a partial region. Consequently, there arises a problem that a breakdown state not derived from incident light occurs and the noise of a signal output from the pixel is increased.

The present technology has been made in view of such circumstances, and an object of the present technology is to cause incident light to be collected to a region where a SPAD is formed while placing an electrode etc. in a central portion of the SPAD.

Solution to Problem

The present technology has been made to solve the above problem. According to a first aspect of the present technology, a solid-state imaging element includes: a photodiode that includes a light receiving surface and an electrode placed on the light receiving surface, and that outputs an electrical signal in accordance with light incident on the light receiving surface in a state where a voltage exceeding a breakdown voltage is applied to the electrode; and a light collecting section that causes light from a subject to be collected in the light receiving surface other than a region where the electrode is placed. Thereby, there is provided a solid-state imaging element including a SPAD that is a photodiode that includes a light receiving surface and an electrode placed on the light receiving surface and that outputs an electrical signal in accordance with light that is incident on the light receiving surface in a state where a voltage exceeding the breakdown voltage is applied to the electrode. This provides an action in which light derived from a subject is collected to the light receiving surface.

In addition, according to the first aspect, in the photodiode, the electrode may be placed substantially at a center of the light receiving surface. This provides an action in which the electric field in the light receiving surface of the SPAD is equalized.

In addition, according to the first aspect, the light collecting section may include a microlens having a concavity in a substantially central portion. This provides an action in which light is collected to the light receiving surface of the SPAD by a microlens having a concavity in a substantially central portion.

In addition, according to the first aspect, the microlens may have an opening in the concavity. This provides an action in which light is collected to the light receiving surface of the SPAD by a microlens having a concavity and an opening in a substantially central portion.

In addition, according to the first aspect, the solid-state imaging element may further include wiring that is electrically connected the electrode, and the microlens may have a concavity continuing along the wiring. This provides an action in which light is collected to the light receiving surface of the SPAD by a microlens having a concavity continuing along wiring.

In addition, according to the first aspect, the microlens may have a cut in a bottom portion of the continuing concavity. This provides an action in which Light is collected to the light receiving surface of the SPAD by a microlens having a concavity and a cut continuing along wiring.

In addition, according to the first aspect, the light collecting section may include a plurality of microlenses each of which is configured to cause light to be collected in the light receiving surface other than a region where the electrode is placed. This provides an action in which light is collected to the light receiving surface of the SPAD by a plurality of microlenses.

In addition, according to the first aspect, the solid-state imaging element may further include wiring that is placed between the plurality of microlenses adjacent to each other, and that is electrically connected to the electrode. This provides an action in which wiring is placed between microlenses.

In addition, according to the first aspect, each of the plurality of microlenses may have a quadrangular bottom surface. This provides an action in which light is collected to the light receiving surface of the SPAD by a plurality of microlenses each having a quadrangular bottom portion.

In addition, according to the first aspect, the light collecting section may include a first light collecting member and a second light collecting member that are sequentially arranged between the electrode and the subject, the second light collecting member having a larger refractive index than the first light collecting member. This provides an action in which light is collected to the light receiving surface of the SPAD by a first light collecting member and a second light collecting member with different refractive indices.

In addition, according to a second aspect of the present technology, an imaging device includes: a pixel circuit in which pixels each of which includes a photodiode and a light collecting section are arranged in a two-dimensional array form, the photodiode including a light receiving surface and an electrode placed on the light receiving surface, and outputting an electrical signal in accordance with light incident on the light receiving surface in a state where a voltage exceeding a breakdown voltage is applied to the electrode, the light collecting section causing light from a subject to be collected in the light receiving surface other than a region where the electrode is placed; and a processing circuit that processes the output electrical signal. This provides an action in which light derived from a subject is collected to a light receiving surface of a SPAD.

Advantageous Effects of Invention

According to the present technology, an excellent effect in which, while an electrode etc. are placed in a central portion of a SPAD, incident light is caused to be collected to a light receiving surface of the SPAD, and detection efficiency is improved can be exhibited. Note that the effect described herein is not necessarily a limitative one, and there may be any of the effects described in the present disclosure.

BRIEF DESCRIPTION OF DRAWINGS

FIG. 13 is a diagram showing examples of arrangement of pixels in the fifth embodiment of the present technology.

FIG. 14 is a diagram showing examples of arrangement of pixels in a modification example of the fifth embodiment of the present technology.

MODE(S) FOR CARRYING OUT THE INVENTION

Hereinbelow, embodiments for implementing the present technology (hereinafter, referred to as embodiments) are described. The description is given in the following order.
1. First embodiment (example of case of being used for distance measuring sensor)
2. Second embodiment (example of case where microlens having cut is used)
3. Third embodiment (example of case where plurality of microlenses are used)
4. Fourth embodiment (example of case where light is collected by light collecting members with different refractive indices)
5. Fifth embodiment (example of case of being used for imaging in low-illuminance environment)
6. Sixth embodiment (example of case where pupil correction is performed)

1. First Embodiment

Figure 1:
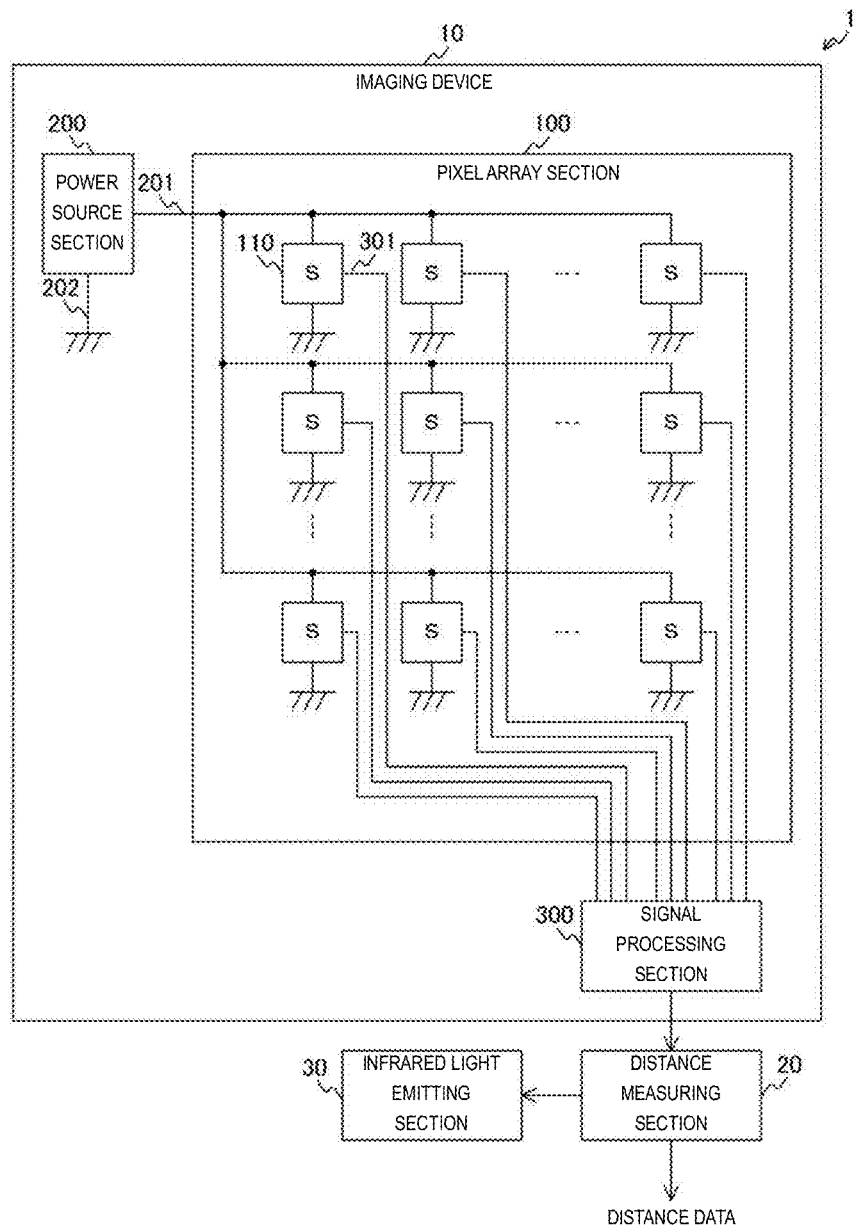
FIG. 1 is a diagram showing an example of a configuration of an imaging system 1 in a first embodiment of the present technology.

[Configuration of Imaging Device]
FIG. 1 is a diagram showing an example of the configuration of an imaging system 1 in a first embodiment of the present technology. The drawing shows an example of the configuration of the imaging system 1 that performs the measurement of the distance to a subject. The imaging system 1 includes an imaging device 10, a distance measuring section 20, and an infrared light emitting section 30.

The imaging device 10 performs the detection of incident light. The imaging device 10 outputs an electrical signal in accordance with the incident light.

The infrared light emitting section 30 emits infrared light to a subject. The infrared light emitting section 30 emits infrared light under the control of the distance measuring section 20.

The distance measuring section 20 measures the distance to the subject on the basis of an electrical signal output from the imaging device 10. The distance measuring section 20 performs distance measurement of a time-of-flight (TOF) system. The measurement of the distance can be performed by the following procedure. First, the distance measuring section 20 controls the infrared light emitting section 30 to cause the infrared light emitting section 30 to start emitting infrared light. If the emitted infrared light is reflected by the subject and is incident on the imaging device 10, the imaging device 10 detects the incident light, converts the incident light to an electrical signal, and outputs the electrical signal to the distance measuring section 20. The distance measuring section 20 measures the time from the start of the radiation of infrared light by the infrared light emitting section 30 to the output of the electrical signal in the imaging device 10, and performs the calculation of the distance to the subject on the basis of the measured time.

The imaging device 10 includes a pixel array section 100, a power source section 200, and a signal processing section 300.

The pixel array section 100 includes pixels 110 arranged in a two-dimensional array form. The pixel 110 generates an electrical signal in accordance with incident light. The generation of an electrical signal in the pixel 110 is performed by a SPAD. The generated electrical signal is individually input to the signal processing section 300 by a signal line 301. Further, electric power is supplied to these pixels 110 from the power source section 200 via a power supply line 201 and a grounding conductor 202. Note that the pixel 110 is an example of a solid-state imaging element described in the claims. The pixel array section 100 is an example of a pixel circuit described in the claims.

The power source section 200 supplies electric power to the pixel 110 of the pixel array section 100.

The signal processing section 300 processes electrical signals output from the plurality of pixels 110 arranged in the pixel array section 100. As the processing, for example, the processing of shaping the waveform of an electrical signal and outputting the shaped waveform may be performed. Note that the signal processing section 300 is an example of a processing circuit described in the claims.

[Circuit Configuration of Pixel]

Figure 2:
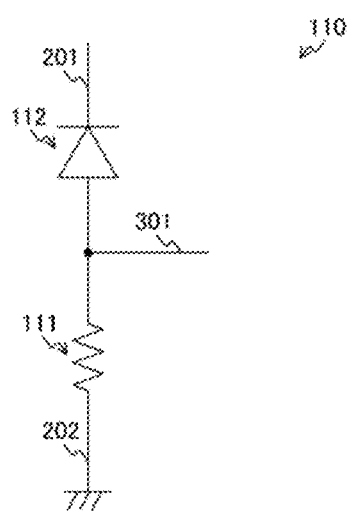
FIG. 2 is a diagram showing an example of a configuration of a pixel 110 in the first embodiment of the present technology.

FIG. 2 is a diagram showing an example of the configuration of the pixel 110 in the first embodiment of the present technology. The drawing shows a circuit configuration of the pixel 110. The pixel 110 includes a SPAD 112 and a resistance 111. The cathode of the SPAD 112 is connected to the power supply line 201, and the anode is connected to the signal line 301 and one end of the resistance 111. The other end of the resistance 111 is connected to the grounding conductor 202.

The SPAD 112 is an element that performs photoelectric conversion of converting light to an electrical signal. Further, the SPAD 112 further performs the multiplication of carriers generated by photoelectric conversion. Details of the configuration of the SAPD 112 are described later.

The resistance 111 is a resistance for performing quenching described later. A power supply voltage is applied to both ends of the SPAD 112 and the resistance 111 connected in series via the power supply line 201 and the grounding conductor 202. The output of the pixel 110 can be extracted from an intermediate point between the SPAD 112 and the resistance 111 via the signal line 301. It is also possible to use, in place of the resistance 111, a constant current circuit including a MOS transistor or the like. Thus, unlike an ordinary photodiode, the SPAD 112 outputs an electrical signal in accordance with light that is incident in a state where a power supply voltage is applied.

[Configuration of Pixel]

Figure 3:
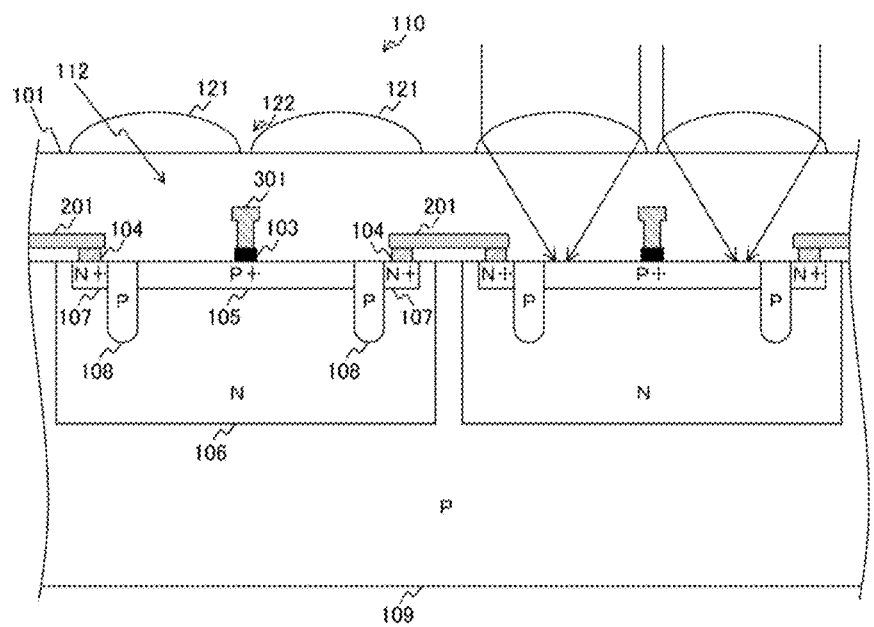
FIG. 3 is a cross-sectional view showing an example of a configuration of the pixel 110 in the first embodiment of the present technology.

FIG. 3 is a cross-sectional view showing an example of the configuration of the pixel 110 in the first embodiment of the present technology. The drawing is a schematic cross-sectional view showing an example of a configuration in which two pixels 110 are arranged.

The pixel 110 includes a microlens 121 and an insulating layer 101, in addition to the SPAD 112, the power supply line 201, and the signal line 301. Note that a description of the resistance 111 is omitted.

The SPAD 112 includes a first semiconductor region 105, a second semiconductor region 106, a third semiconductor region 107, a guard ring 108, an electrode 103, and an electrode 104. The SPAD 112 can be manufactured by the following procedure, for example. First, an n-type second semiconductor region 106 is formed as a well region of a p-type semiconductor substrate 109. Next, a p-type first semiconductor region 105, a p-type guard ring 108, and an n-type third semiconductor region 107 are further formed in the interior of the second semiconductor region 106. The well region and the semiconductor region can be formed by ion implantation or the like. Next, the electrodes 103 and 104 are formed on surfaces of the first semiconductor region 105 and the third semiconductor region 107, respectively. Thereby, the SPAD 112 can be manufactured.

Each of the first semiconductor region 105 and the third semiconductor region 107 has a relatively high impurity concentration, and is formed in a relatively shallow region of the surface of the second semiconductor region 106. As described later, the first semiconductor region 105 is formed in a disc-like shape. The guard ring 108 is formed in an annular shape, and is placed on the outside of the first semiconductor region 105. Also the third semiconductor region 107 is formed in an annular shape similarly to the guard ring 108, and is placed on the outside of the guard ring 108.

The electrode 103 is an electrode formed on the first semiconductor region 105, and operates as an anode electrode. The electrode 103 has a disc-like shape, and is placed on a substantially central portion of the first semiconductor region 105. On the other hand, the electrode 104 is an electrode formed on the third semiconductor region 107, and operates as a cathode electrode. The electrode 104 has an annular shape, and is formed along the third semiconductor region 107. The signal line 301 and the power supply line 201 are connected to the electrode 103 and the electrode 104, respectively. Note that the electrode 103 and the signal line 301 may be formed simultaneously as one body. Similarly, also the electrode 104 and the power supply line 201 may be formed simultaneously as one body. Further, the electrode 103 and 104 may contain a metal. Similarly, also the power supply line 201 and the signal line 301 may contain a metal. Note that the electrode 103 is an example of an electrode described in the claims.

If light from the subject is emitted to the first semiconductor region 105, the emitted light is transmitted through the first semiconductor region 105, and arrives at the second semiconductor region 106. Here, photoelectric conversion is performed and carriers are generated. Thus, the first semiconductor region 105 corresponds to a light receiving surface in the SPAD 112. As described in FIG. 2, a power supply voltage is always applied to the SPAD 112. This voltage is applied in the reverse direction with respect to the SPAD 112. That is, a voltage of a positive polarity is applied to the electrode 104 (the cathode electrode), and a voltage of a negative polarity is applied to the electrode 103 (the anode electrode). Hence, a depletion layer is formed in a p-n junction portion based on the first semiconductor region 105 and the second semiconductor region 106. Most of the voltage applied to the SPAD 112 is divided in this depletion layer portion.

Thus, the photoelectric conversion in the SPAD 112 is performed in a state where a voltage is applied. As described later, the voltage applied to the SPAD 112 is a relatively high voltage exceeding the breakdown voltage. The guard ring 108 prevents the occurrence of a breakdown state that would occur because electric fields generated by the applied voltage concentrate in an end portion of the first semiconductor region 105, what is called edge breakdown. The guard ring 108 may contain, in place of the semiconductor shown in the drawing, a dielectric such as a silicon oxide film, for example.

Note that the configuration of the SPAD 112 is not limited to the configuration shown in the drawing. For example, the first semiconductor region 105 may contain an n-type semiconductor, and each of the second semiconductor region 106 and the third semiconductor region 107 may contain a p-type semiconductor. Further, also a semiconductor other than silicon may be used.

The insulating layer 101 insulates the power supply line 201 and the signal line 301, and transmits incident light.

The microlens 121 is a light collecting section that collects light incident on the pixel 110. As described later, the microlens 121 has a doughnut-like shape having a hemispherical cross section, and collects light derived from the subject to the first semiconductor region 105 (a light receiving surface) other than the region where the electrode 103 and the signal line 301 are placed. This situation is shown in the right side of the drawing. Thereby, light emitted to a region not taking part in photoelectric conversion, such as the electrode 103, can be guided to the p-n junction portion of the SPAD 112, and detection efficiency can be improved.

[Configuration of Microlens]

Figure 4:
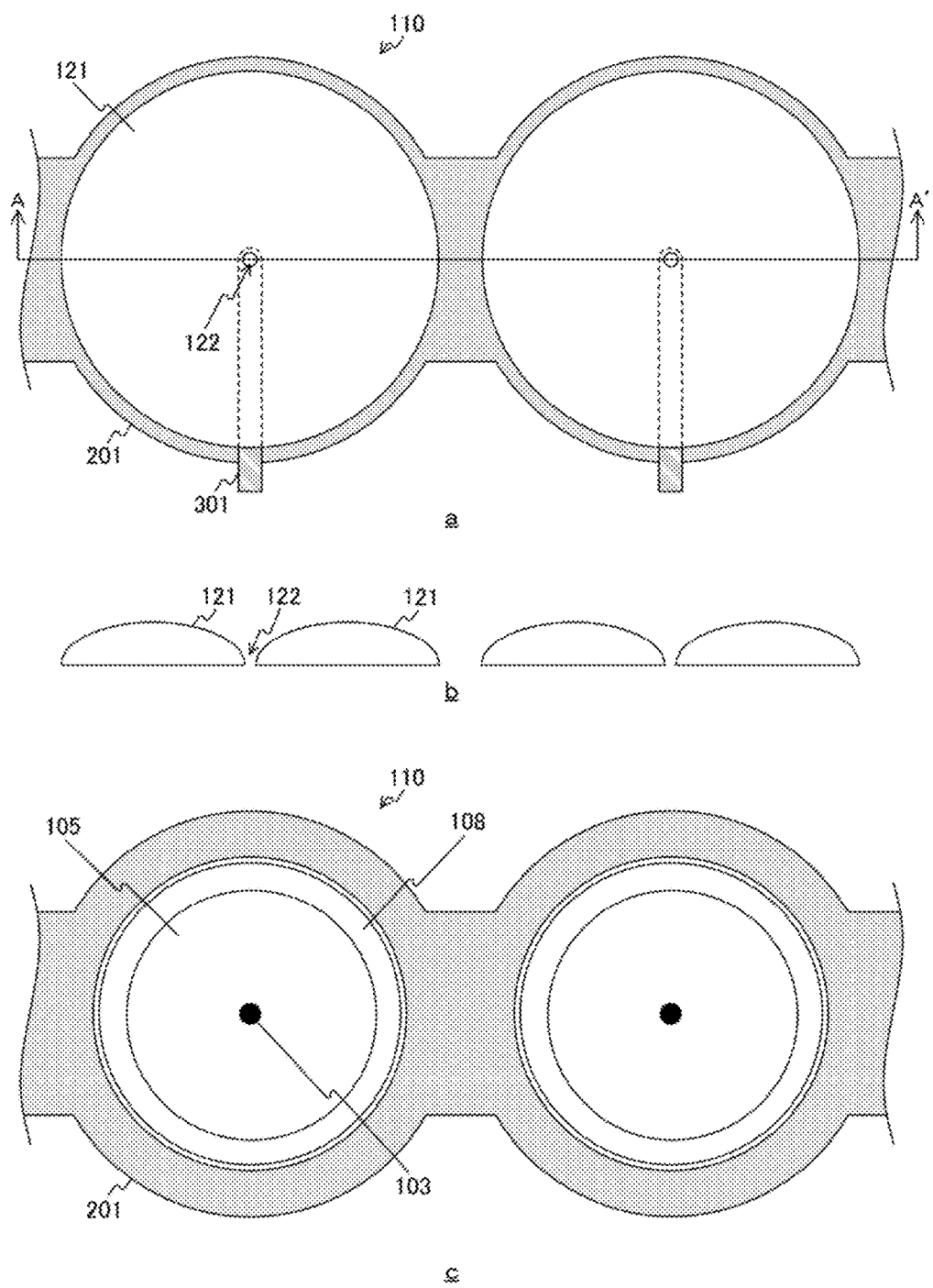
FIG. 4 is a diagram showing an example of a configuration of a microlens 121 in the first embodiment of the present technology.

FIG. 4 is a diagram showing an example of the configuration of the microlens 121 in the first embodiment of the present technology. "a" in the drawing shows a top view of the pixel 110. "b" in the drawing shows a cross-sectional view of the microlens 121 taken along line A-A' of "a" in the drawing. "c" in the drawing shows a top view of the pixel 110 excluding the microlens 121 and the signal line 301. Note that FIG. 3 described above corresponds to a cross-sectional view of the pixel 110 taken along line A-A' of "a" in the drawing.

As shown in the drawing, the microlens 121 has a shape having a concavity in a substantially central portion. Furthermore, the microlens 121 of the drawing has a doughnut-like shape having an opening 122 in the concavity, and has a hemispherical cross section. Further, the microlens 121 is placed in a substantially central portion of the pixel 110. As described above, the electrode 103 is placed on a substantially central portion of the first semiconductor region 105 formed in a disc-like shape, and the microlens 121 is placed in a position whereby the opening 122 and the electrode 103 overlap. Thereby, light incident on the pixel 110 avoids the electrode 103 and the wiring 301 placed on the electrode 103, and is collected to the first semiconductor region 105. Note that the configuration of the microlens 121 is not limited to the configuration shown in the drawing. For example, also a configuration in which the opening 122 is omitted and a concavity is provided in a central portion is possible.

[Method for Forming Microlens]

The microlens 121 can be formed by the following procedure. A resist is applied on the insulating layer 101, and is patterned into an annular shape. Next, the whole workpiece is heated by a reflow furnace or the like to melt the resist. In this event, the cross section of the patterned resist becomes a hemispherical shape due to surface tension. After that, these are cooled; thereby, the microlens 121 of a doughnut shape can be formed. A photosensitive acrylic resin or the like may be used for the resist.

[Characteristics of SPAD]

Figure 5:
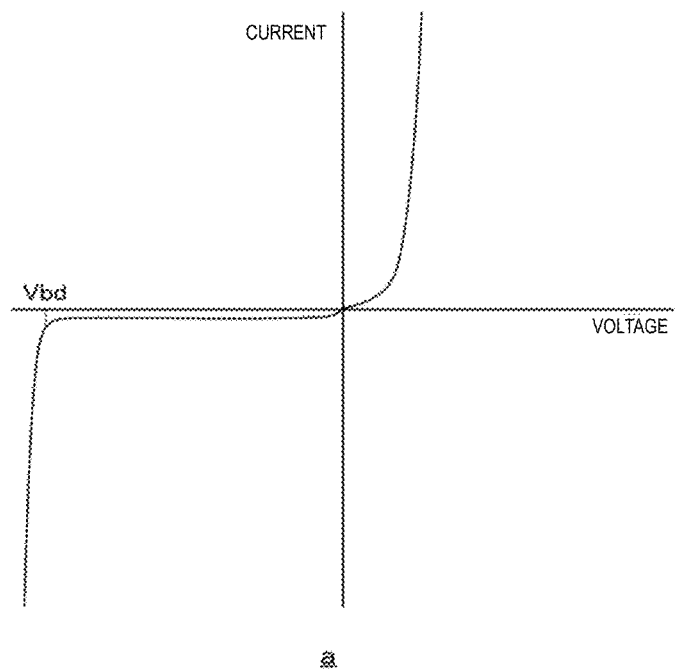
FIG. 5 is a diagram showing characteristics of a SPAD 112 in an embodiment of the present technology.
Figure 5:
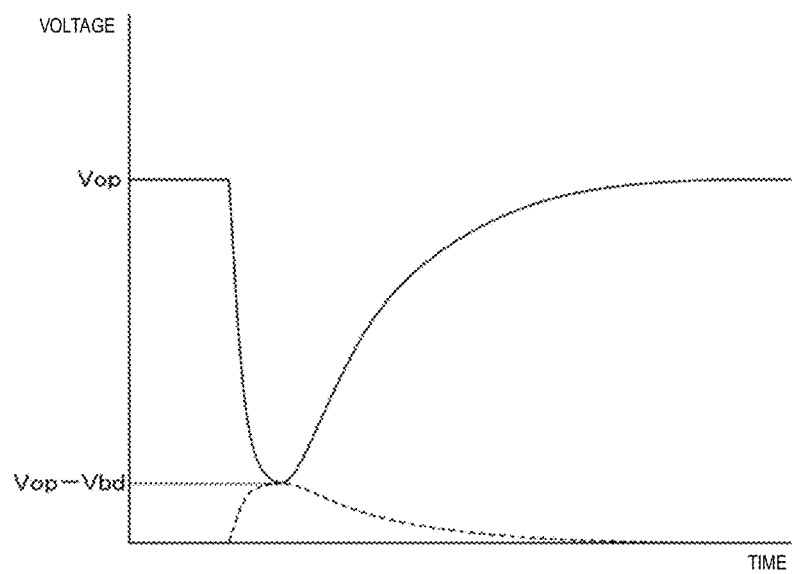

FIG. 5 is a diagram showing characteristics of the SPAD 112 in an embodiment of the present technology. "a" in the drawing is a diagram showing a relationship between the applied voltage and the current of the SPAD 112. It can be seen that, if a voltage is applied in the reverse direction with respect to the SPAD 112, the flowing current rapidly increases at applied voltages more than or equal to a prescribed breakdown voltage Vbd. The breakdown voltage Vbd is a voltage at which an electron avalanche can occur in the depletion layer formed in the p-n junction portion based on the first semiconductor region 105 and the second semiconductor region 106. In "a" in the drawing, the region where reverse voltages more than or equal to breakdown voltage Vbd are applied is referred to as an avalanche region, and is a region where the action of carrier multiplication by an electron avalanche occurs. The electron avalanche is a phenomenon in which impact ionization caused by an electron accelerated by a strong electric field in a depletion layer occurs and a new carrier is generated, and thereby carriers are multiplied. The action of carrier multiplication based on photoelectric conversion is made by the electron avalanche. However, in this region, there is a proportional relation between the amount of incident light and the current flowing through the SPAD 112.

In the avalanche region, if a still higher reverse voltage is applied, the action of carrier multiplication based on an electron avalanche is increased, and the multiplication factor reaches a value of approximately $10^6$. This region is referred to as the Geiger region, which is a region where the output current is not proportional to the amount of incident light. In this region, the SPAD 112 can be used as an element that detects whether a photon is incident or not. For example, the SPAD 112 can be used in the Geiger region by applying a voltage higher than the breakdown voltage Vbd by several volts.

"b" in the drawing shows the waveform of a voltage based on the SPAD 112 that has entered a breakdown state. The solid line of "b" in the drawing shows the voltage between the cathode and the anode of the SPAD 112. Further, the dotted line of "b" in the drawing shows the voltage of the signal line 301 described in FIG. 2. This corresponds to the output voltage of the SPAD 112. The voltage between the cathode and the anode of the SPAD 112 before entering a breakdown state is a value substantially equal to the power supply voltage Vop. In this event, if light is incident on the SPAD 112, a large current flows through the resistance 111 and the SPAD 112 due to the action of carrier multiplication. Accordingly, the voltage applied to the SPAD 112 rapidly decreases due to a voltage drop by the resistance 111. Then, if the voltage applied to the SPAD 112 reaches the breakdown voltage Vbd, the action of carrier multiplication in the SPAD 112 stops, and the current decreases. After that, the SPAD 112 returns to the initial state. Such a return operation from a breakdown state by the resistance 111 is referred to as quenching.

Since carriers have been caught in traps or the like in the SPAD 112 immediately after returning from the breakdown state, there is a case where, when Vop is applied for the second time, the state returns to a breakdown state due to carriers released from traps or the like. The change in output voltage based on the breakdown state of the second time is referred to as an after-pulse. The power source section 200 described in FIG. 1 can gradually increase the output voltage after quenching, as shown in "b" in the drawing. Thereby, the occurrence of an after-pulse can be prevented. The maximum voltage of the output of the signal line 301 is a pulsed voltage substantially equal to Vop-Vbd. This output is shaped by the signal processing section 300, and is output to the distance measuring section 20 as an output signal of the imaging device 10. Thus, the SPAD 112 outputs an electrical signal in accordance with light that is incident on the first semiconductor region 105, which is a light receiving surface, in a state where a voltage exceeding the breakdown voltage is applied.

On the other hand, since a voltage exceeding the breakdown voltage Vbd is applied as described above, also a breakdown state not derived from the radiation of light may occur. In particular, in a case where the electric potential distribution of the first semiconductor region 105 is unequal, a local concentration of electric fields occurs, and a breakdown state not derived from the radiation of light occurs. This is a cause of noise. In order to prevent such a concentration of electric fields, the guard ring 108 is provided, and the electrode 103 is placed on a central portion of the first semiconductor region 105. Thereby, the electric potential distribution of the first semiconductor region 105 can be equalized, and a concentration of electric fields can be prevented.

However, if the electrode 103 is placed at the center of the first semiconductor region 105, light is blocked by the electrode 103, and detection efficiency is reduced. Thus, the microlens 121 of the shape described in FIGS. 3 and 4 is used, and incident light is caused to be collected to a region other than the central portion of the first semiconductor region 105. That is, incident light is caused to be collected to a light receiving surface other than the region where the electrode 103 etc. are placed. Thereby, a reduction in detection efficiency can be prevented.

Thus, according to the first embodiment of the present technology, by placing the microlens 121 having a concavity in a substantially central portion, incident light can be collected to a light receiving surface so as to avoid the electrode 103 placed in a central portion of the SPAD 112. Thereby, detection efficiency can be improved.

2. Second Embodiment

In the first embodiment described above, the microlens 121 having a concavity in a central portion is used. In contrast, in a second embodiment of the present technology, a microlens of a shape having a cut running along the signal line 301 is used. Thereby, detection efficiency can be further improved.

[Configuration of SPAD]

Figure 6:
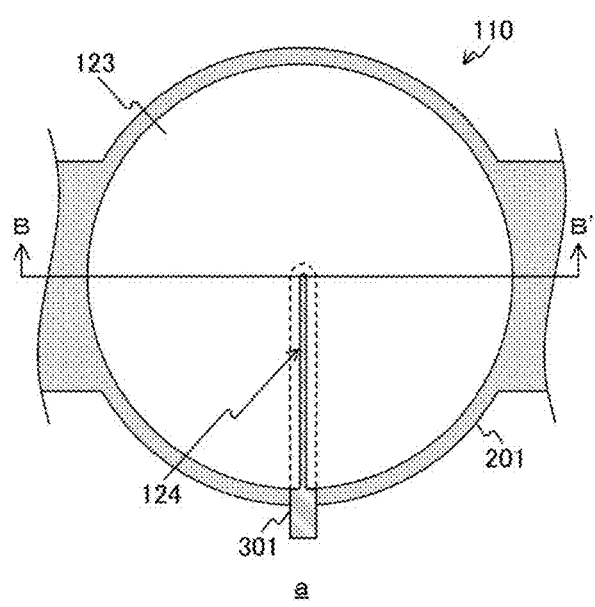
FIG. 6 is a diagram showing an example of a configuration of a microlens 123 in a second embodiment of the present technology.
Figure 6:
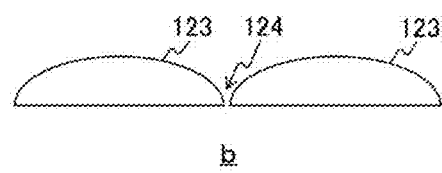

FIG. 6 is a diagram showing an example of the configuration of a microlens 123 in the second embodiment of the present technology. "a" in the drawing shows a top view of the pixel 110. The pixel 110 of the drawing differs from the pixel 110 described in FIG. 4 in that the microlens 123 is provided in place of the microlens 121. Further, "b" in the drawing is a diagram showing a cross section of the microlens 123 taken along line B-B' of "a" in the drawing.

As shown in "a" in the drawing, the microlens 123 has a shape having a concavity continuing along the signal line 301. Furthermore, the microlens 123 has a cut 124 in a bottom portion of the continuing concavity. The cut 124 is placed along the signal line 301, and therefore light emitted to a region of the signal line 301 excluding the region overlapping with the cut 124 can be caused to be collected onto the first semiconductor region 105. That is, light emitted to a portion where the signal line 301 traverses the first semiconductor region 105 can be caused to be collected to the first semiconductor region 105, which is a light receiving surface. Note that the configuration of the microlens 123 is not limited to the configuration shown in the drawing. For example, also a configuration in which the cut 124 is omitted and a concavity continuing along the signal line 301 is provided is possible. Note that the signal line 301 is an example of wiring described in the claims.

The configuration of the pixel 110 etc. other than the above is similar to the configuration of the pixel 110 etc. described in the first embodiment of the present technology, and therefore a description is omitted.

Thus, according to the second embodiment of the present technology, by using the microlens 123 having the cut 124, light emitted to the signal line 301 excluding the region overlapping with the cut 124 can be collected to the first semiconductor region 105. Thereby, detection efficiency can be further improved.

3. Third Embodiment

In the first embodiment described above, the microlens 121 having a concavity in a central portion is used. In contrast, in a third embodiment of the present technology, light collection is performed by a plurality of microlenses. Thereby, detection efficiency can be improved.

[Configuration of SPAD]

Figure 7:
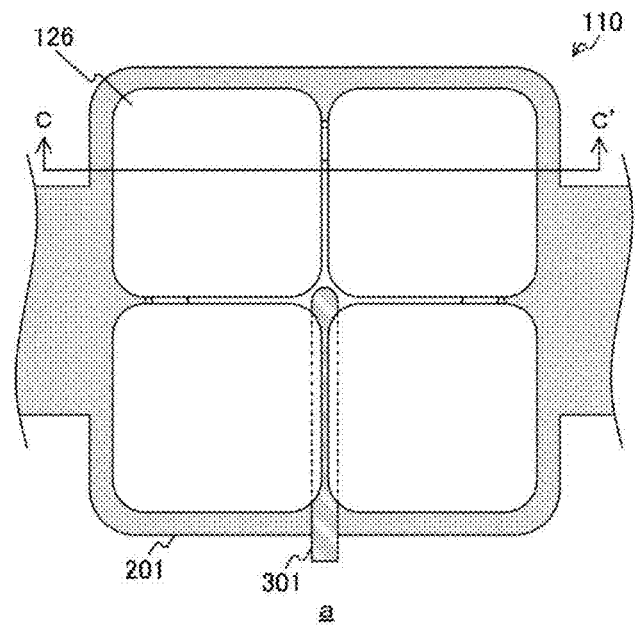
FIG. 7 is a diagram showing an example of a configuration of the pixel 110 in a third embodiment of the present technology.
Figure 7:
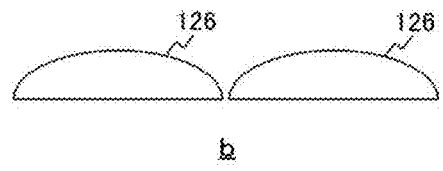
Figure 7:
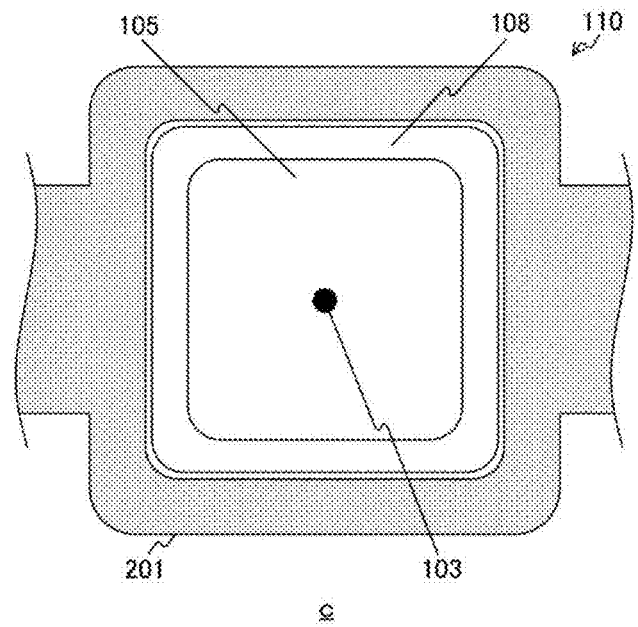

FIG. 7 is a diagram showing an example of the configuration of the pixel 110 in the third embodiment of the present technology. "a" in the drawing shows a top view of the pixel 110. "b" in the drawing shows a cross-sectional view of microlenses 126 taken along line C-C' of "a" in the drawing. "c" in the drawing shows a top view of the pixel 110 excluding the microlenses 126 and the wiring 301.

The pixel 110 of the drawing includes four microlenses 126 in place of the microlens 121. Each of these microlenses 126 has a quadrangular bottom portion, and collects light to the first semiconductor region 105, which is a light receiving surface. Further, the pixel 110 of the drawing includes a quadrangular first semiconductor region 105, and a guard ring 108 and a third semiconductor region 107 having a quadrangular outer peripheral portion. That is, in the pixel 110 of the drawing, a SPAD 112 having a quadrangular surface is placed. Further, the electrode 103 is placed on a central portion of the first semiconductor region 105. Note that a cross section of the pixel 110 in the third embodiment of the present technology has a similar configuration to the pixel 110 described in FIG. 4, and therefore a description is omitted.

As shown in "a" in the drawing, a plurality of microlenses 126 are arranged in the pixel 110 of the third embodiment of the present technology. Each of these microlenses 126 causes incident light to be collected to the first semiconductor region 105, which is a light receiving surface. Further, the electrode 103 and the signal line 301 are placed between ones of these microlenses 126. Thereby, incident light can be collected to the first semiconductor region 105 other than the region where the electrode 103 etc. are placed. Since a bottom portion of the microlens 126 has a quadrangular shape, the occupation area of the microlenses in the pixel 110 can be larger than in the pixel 110 described in FIG. 3. Hence, light emitted to a large area of the pixel 110 can be collected to the first semiconductor region 105, and detection efficiency can be further improved. Note that the configuration of the microlens 126 is not limited to the configuration shown in the drawing. For example, also a configuration having a circular bottom portion is possible.

The configuration of the pixel 110 etc. other than the above is similar to the configuration of the pixel 110 etc. described in the first embodiment of the present technology, and therefore a description is omitted.

Thus, according to the third embodiment of the present technology, by using a plurality of microlenses and placing the electrode 103 and the signal line 301 between ones of them, incident light can be collected to the first semiconductor region 105. Thereby, detection efficiency can be improved.

4. Fourth Embodiment

In the first embodiment described above, light collection is performed by the microlens 121. In contrast, in a fourth embodiment of the present technology, light collection is performed by two members with different refractive indices. Thereby, the configuration of the pixel can be simplified.

[Configuration of SPAD]

Figure 8:
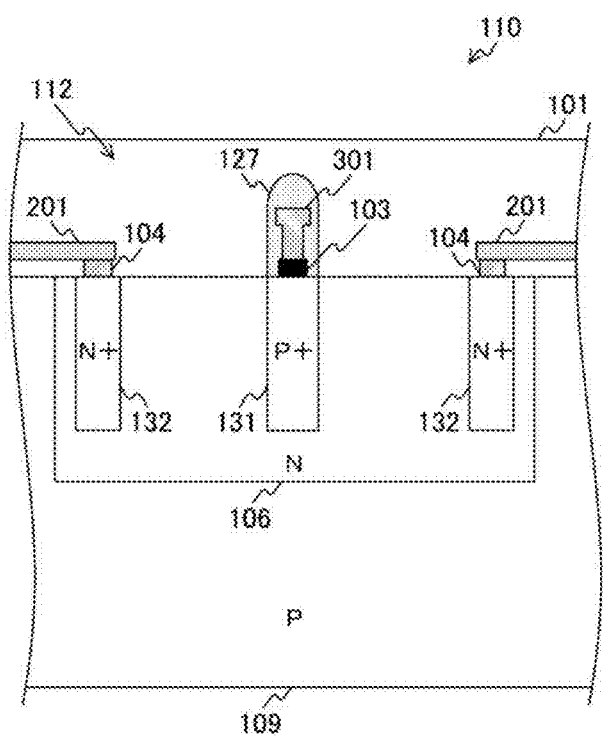
FIG. 8 is a cross-sectional view showing an example of a configuration of the pixel 110 in a fourth embodiment of the present technology.

FIG. 8 is a cross-sectional view showing an example of the configuration of the pixel 110 in the fourth embodiment of the present technology. The pixel 110 of the drawing includes, as compared to the pixel 110 described in FIG. 4, a first light collecting member 127 in place of the microlens 121. Further, as compared to the SPAD 112 described in FIG. 4, the SPAD 112 of the drawing does not need to include the guard ring 108. Furthermore, the SPAD 112 of the drawing includes, in place of the first semiconductor region 105 and the third semiconductor region 107, a first semiconductor region 131 and a third semiconductor region 132.

The first semiconductor region 131 is formed in a substantially central portion of the second semiconductor region 106, and has a circular columnar shape. The third semiconductor region 132 has an annular shape similarly to the third semiconductor region 107 in FIG. 3. Further, a bottom portion of each of the first semiconductor region 131 and the third semiconductor region 132 is formed so as to reach a relatively deep region of the second semiconductor region 106. Thus, the SPAD 112 of the drawing has a lateral structure in which a p-n junction portion is placed in a lateral direction with respect to the semiconductor substrate 109. Hence, the SPAD 112 of the drawing does not need to consider the concentration of electric fields in an end portion of the first semiconductor region 131, and can omit the guard ring 108. In this case, a surface of the second semiconductor region 106 serves as a light receiving surface.

Further, the first light collecting member 127 is placed between the electrode 103 and the insulating layer 101. The first light collecting member 127 transmits light similarly to the insulating layer 101. Here, the refractive indices of the first light collecting member 127 and the insulating layer 101 are different, and the insulating layer 101 contains a material with a higher refractive index. Thus, in the light collecting section in the fourth embodiment of the present technology, the first light collecting member 127 and the insulating layer 101 are arranged in order between the electrode 103 and the subject. Further, the light collecting member 127 of the drawing has a bell-like shape. Note that the insulating layer 101 is an example of a second light collecting member described in the claims.

[Light Collection Method by Light Collecting Members]

Figure 9:
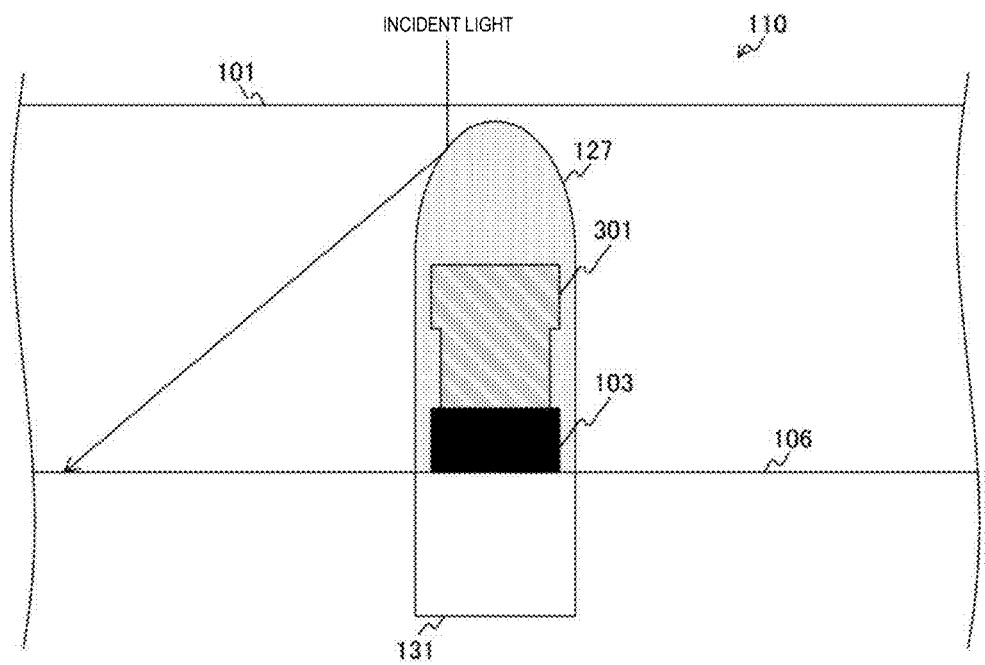
FIG. 9 is a diagram showing an example of light collection in the fourth embodiment of the present technology.

FIG. 9 is a diagram showing an example of light collection in the fourth embodiment of the present technology. The drawing shows a situation of light collection by the first light collecting member 127 and the insulating layer 101. In the drawing, the optical path of light incident from above the electrode 103 and the signal line 301 changes due to refraction at the interface between the insulating layer 101 and the first light collecting member 127. As described above, the insulating layer 101 has a larger refractive index than the first light collecting member 127; thus, when light is incident on the first light collecting member 127 from the insulating layer 101, the light is refracted in such a direction that the angle of refraction is larger. On the other hand, in a case where the angle of incidence is more than the critical angle, the light is totally reflected at the interface between the light collecting member 127 and the insulating layer 101. Thus, as shown in the drawing, the optical path of incident light changes, and light can be collected to the second semiconductor region 106, which is a light receiving surface.

The configuration of the pixel 110 etc. other than the above is similar to the configuration of the pixel 110 etc. described in the first embodiment of the present technology, and therefore a description is omitted.

Thus, according to the fourth embodiment of the present technology, by causing incident light to be totally reflected using the first light collecting member 127 and the insulating layer 101 with different refractive indices, the incident light can be collected to a light receiving surface, and a microlens can be omitted. Thereby, the configuration of the pixel 110 can be simplified.

Modification Example

Although the SPAD 112 of a lateral structure is used in the fourth embodiment described above, the SPAD 112 of the structure described in FIG. 4 may be used. This is because light collection to a light receiving surface by the first light collecting member 127 and the insulating layer 101 is possible.

[Configuration of SPAD]

Figure 10:
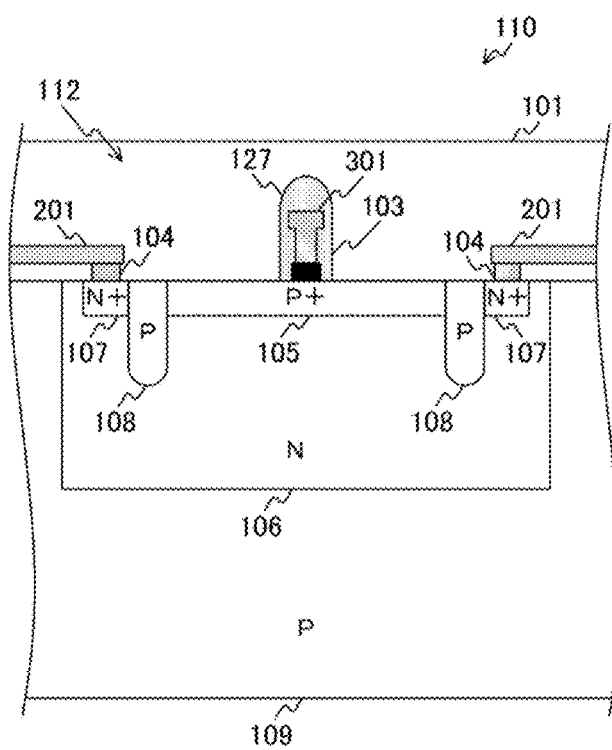
FIG. 10 is a cross-sectional view showing an example of a configuration of the pixel 110 in a modification example of the fourth embodiment of the present technology.

FIG. 10 is a cross-sectional view showing an example of the configuration of the pixel 110 in a modification example of the fourth embodiment of the present technology. The SPAD 112 of the drawing has a similar configuration to the SPAD 112 described in FIG. 4. Also in the pixel 110 of the drawing, light collection to the first semiconductor region 105, which is a light receiving surface, by the light collecting member 127 and the insulating layer 101 can be performed.

The configuration of the pixel 110 etc. other than the above is similar to the configuration of the pixel 110 etc. described in the fourth embodiment of the present technology, and therefore a description is omitted.

5. Fifth Embodiment

In the first embodiment described above, a SPAD is used as a sensor for distance measurement. In contrast, in a fifth embodiment of the present technology, a SPAD is used for imaging. Thereby, the sensitivity of an imaging device in a low-illuminance environment can be improved.

[Configuration of Imaging Device]

Figure 11:
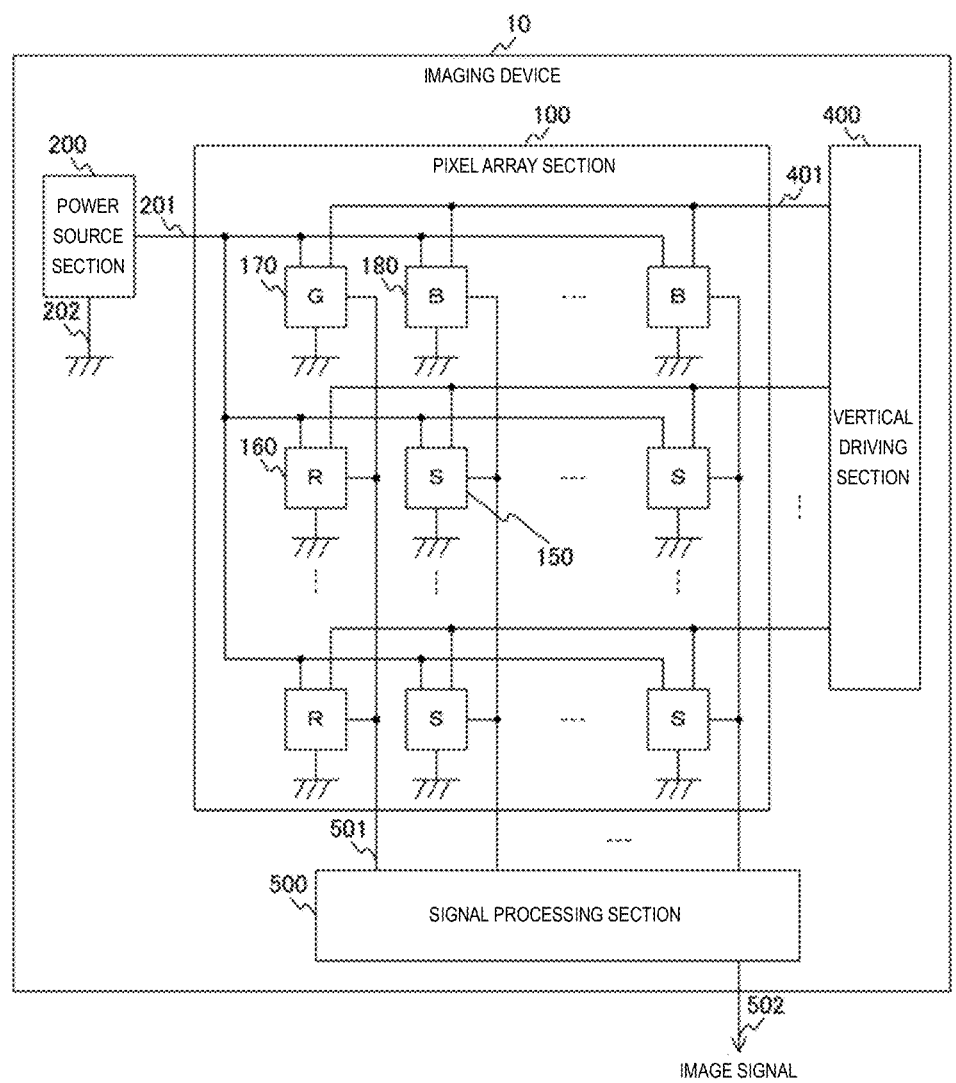
FIG. 11 is a diagram showing an example of a configuration of an imaging device 10 in a fifth embodiment of the present technology.

FIG. 11 is a diagram showing an example of the configuration of the imaging device 10 in the fifth embodiment of the present technology. The imaging device 10 differs from the imaging device 10 described in FIG. 1 in that a vertical driving section 400 is further provided and a signal processing section 500 is provided in place of the signal processing section 300.

The pixel array section 100 of the drawing differs from the pixel array section 100 described in FIG. 1 in that pixels 150 each including a SPAD and pixels 160, 170, and 180 each including an ordinary photodiode are arranged in a two-dimensional array form. Each of the pixels 160, 170, and 180 is a pixel that includes a color filter and generates an image signal in accordance with light of a specific wavelength. The drawing shows an example in which a red pixel that generates an image signal in accordance with red light, a green pixel that generates an image signal in accordance with green light, and a blue pixel that generates an image signal in accordance with blue light are arranged as the pixels mentioned above. In the drawing, the pixels marked with "R", "G," and "B" represent a red pixel (the pixel 160), a green pixel (the pixel 170), and a blue pixel (the pixel 180), respectively. Note that the pixel marked with "S" represents a pixel including a SPAD (the pixel 150). The pixel 150 in the fifth embodiment of the present technology performs the generation of an image signal in a low-illuminance environment. Hence, the pixel 150 does not need to include a color filter. These pixels are arranged in the pixel array section 100 on the basis of a prescribed rule. The drawing shows an example in which arrangement is made such that one of two green pixels in the Bayer array form is replaced with the pixel 150.

Note that the configuration of the pixel array 100 is not limited to the example described above. For example, a color filter may be placed in a pixel including a SPAD. Specifically, like in the pixel 170, a color filter having the property of transmitting green light may be placed for the pixel 150. In this case, the arrangement of color filters may be set to the Bayer array form. The manufacturing of the imaging device 10 based on the manufacturing process of a common imaging device becomes possible.

Further, in the pixel array section 100, row signal lines 401 and column signal lines 501 are arranged in an XY matrix form, and are each drawn to each pixel. The row signal line 401 is a signal line that transmits a control signal to each of the pixels 150 to 160. Further, the column signal line 501 is a signal line that transmits an image signal generated by each of the pixels 150 to 160. The row signal line 401 is drawn in common to, among the pixels 150 etc., the pixels 150 etc. arranged in the same row. Further, the column signal line 501 is drawn in common to the pixels 150 etc. arranged in the same column.

The vertical driving section 400 drives the pixels 150 etc. arranged in the pixel array section 100. The vertical driving section 400 performs driving by outputting a control signal to each of the pixels 150 etc. via the row signal line 401. In this event, the vertical driving section 400 sequentially outputs control signals for each row of the pixel array section 100.

The signal processing section 500 processes an image signal generated by each of the pixels 150 etc. The signal processing section 500 may perform, for example, processing that performs analog/digital conversion on an analog image signal generated by each of the pixels 150 etc. and outputs a digital image signal. Further, image signals of one row are simultaneously input to the signal processing section 500 from the pixel array section 100. The signal processing section 500 further performs horizontal transfer that sequentially outputs digital image signals of one row corresponding to the input image signals. The image signal output from the signal processing section 500 serves as an output image signal of the imaging device 10. Note that the signal processing section 500 is an example of a processing circuit described in the claims.

The power source section 200 further performs the supply of electric power necessary for the operation of the pixels 150 etc., in addition to the supply of electric power to be applied to the SPAD. These flows of electric power are supplied to the pixels 150 etc. via the power supply line 201 and the grounding conductor 202.

[Circuit Configuration of Pixel]

Figure 12:
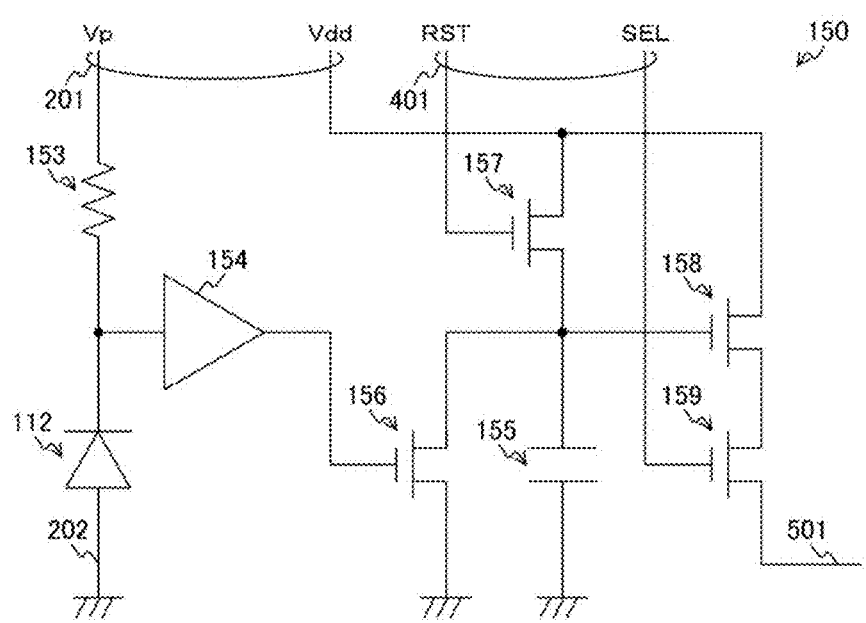
FIG. 12 is a diagram showing an example of a configuration of a pixel 150 in the fifth embodiment of the present technology.

FIG. 12 is a diagram showing an example of the configuration of the pixel 150 in the fifth embodiment of the present technology. The drawing shows a circuit configuration of the pixel 150. The pixel 150 includes the SPAD 112, a resistance 153, a waveform shaping section 154, a retention section 155, and MOS transistors 156 to 159. Note that an N-channel MOS transistor may be used as each of the MOS transistors 156 to 159.

The power supply line 201 includes a plurality of power supply lines (Vp and Vdd). The power supply line Vp is a power supply line that supplies electric power of the SPAD 112. The power supply line Vdd is a power supply line that supplies electric power necessary for the operation of the pixel 150. The row signal line 401 includes a plurality of signal lines (RST and SEL). The reset signal line RST (Reset) is a signal line that transmits a signal to the MOS transistor 157. The selection signal line SEL (Select) is a signal line that transmits a signal to the MOS transistor 159. If a voltage more than or equal to the threshold voltage between the gate and the source of each of the MOS transistors 157 and 159 (hereinafter, referred to as an ON signal) is input via each of these signal lines, the corresponding MOS transistor enters a conduction state.

The anode of the SPAD 112 is connected to the grounding conductor 202, and the cathode is connected to an input of the waveform shaping section 154 and one end of the resistance 153. The other end of the resistance 153 is connected to the power supply line Vp. An output of the waveform shaping section 154 is connected to the gate of the MOS transistor 156. The source of the MOS transistor 156 is connected to the grounding conductor 202, and the drain is connected to the source of the MOS transistor 157, the gate of the MOS transistor 158, and one end of the retention section 155. The other end of the retention section 155 is connected to the grounding conductor 202. The drain and the gate of the MOS transistor 157 are connected to the power supply line Vdd and the reset signal line RST, respectively. The drain and the source of the MOS transistor 158 are connected to the power supply line Vdd and the drain of the MOS transistor 159, respectively. The gate and the source of the MOS transistor 159 are connected to the selection signal line SEL and the column signal line 501, respectively.

Similarly to the resistance 111 described in FIG. 2, the resistance 153 is a resistance for performing quenching. Unlike the circuit of the pixel 110 in FIG. 2, in FIG. 12 the SPAD 112 and the resistance 153 are connected so as to be exchanged. This is in order to make the same connection method as in the photodiodes in the pixels 160 to 180. The output voltage from the SPAD 112 is equivalent to the voltage shown by the solid line of "b" in FIG. 5.

The waveform shaping section 154 shapes the waveform of a signal output from the SPAD 112. If an output signal of the SPAD 112 is input, the waveform shaping section 154 generates a signal of a prescribed voltage and a prescribed pulse width, and outputs the generated signal. A comparator may be used for the waveform shaping section 154, for example.

The MOS transistor 157 is a transistor that applies the power supply voltage Vdd to the retention section 155.

The retention section 155 is a capacitor that retains a voltage in accordance with the output voltage of the SPAD 112.

The MOS transistor 156 discharges the retention section 155. Each time a pulse voltage output from the waveform shaping section 154 is input to the gate, the MOS transistor 156 short-circuits both terminals of the retention section 155 to perform discharging. In this event, the MOS transistor 156 discharges a part of the voltage retained in the retention section 155.

The MOS transistor 158 is a transistor that generates a signal in accordance with the voltage retained in the retention section 155. The MOS transistor 159 is a transistor that outputs the signal generated by the MOS transistor 158, as an image signal.

Operations of the circuit shown in the drawing will now be described. First, an ON signal is input from the reset signal line RST, and the MOS transistor 157 enters a conduction state. Thereby, the retention section 155 is charged to the power supply voltage Vdd. That is, the retention section 155 is reset. If in this state light is emitted to the SPAD 112, the voltage waveform shown by the solid line shown of "b" in FIG. 5 is input to the waveform shaping section 154. The waveform shaping section 154 outputs a pulse voltage in accordance with the input voltage waveform. The MOS transistor 156 is brought into conduction by this pulse voltage, and a part of the voltage retained in the retention section 155 is discharged. That is, each time a voltage waveform derived from the SPAD 112 is input to the waveform shaping section 154, the voltage retained in the retention section 155 is gradually discharged. As described above, the SPAD 112 is caused to operate in the Geiger region; thus, each time one photon is incident, a voltage retained in the retention section 155 is discharged, and the voltage of the retention section 155 changes in accordance with the number of photons incident on the SPAD 112. That is, the number of photons incident on the SPAD 112 can be measured by measuring the voltage of the retention section 155.

If an ON signal is input from the selection signal line SEL after a prescribed exposure time has elapsed, the MOS transistor 159 is brought into conduction, and a signal generated by the MOS transistor 158 is output to the column signal line 501 as an image signal.

Note that a pixel of a publicly known configuration may be used for each of the pixels 160 to 180. Thereby, a voltage in accordance with incident light is output from each of the pixels 160 to 180 as an image signal. Since as described above a voltage in accordance with the number of incident photons is output from the pixel 150, the signal processing section 500 described in FIG. 11 can perform common processing for the image signals output by the pixel 150 and the pixels 160 to 180.

The configuration of the SPAD 112 etc. other than the above is similar to the configuration of the SPAD 112 etc. described in embodiment 1 of the present technology, and therefore a description is omitted.

[Arrangement of Pixels]

Figure 13:
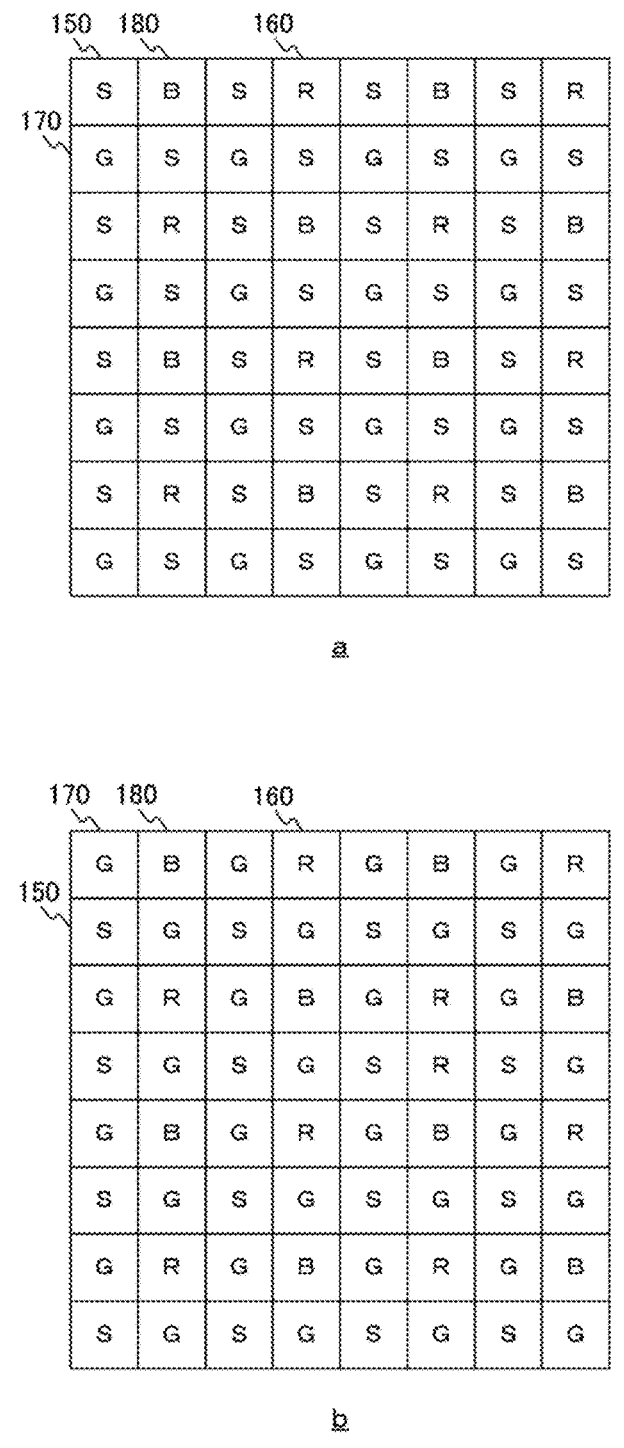

FIG. 13 is a diagram showing examples of the arrangement of pixels in the fifth embodiment of the present technology. The drawing shows examples of arrangements different from the arrangement described in FIG. 11 in regard to the arrangement of the pixels 150 to 180 in the pixel array section 100. "a" in the drawing shows an example in which pixels 150 are arranged in a checkered form, and other pixels are arranged in portions other than the above. Since a large number of pixels 150 each having the SPAD 112 are arranged, the resolution in a low-illuminance environment can be improved. "b" in the drawing shows an example in which pixels 170 are arranged in a checkered form. A large number of pixels 170, which are green pixels, are arranged, and the resolution in an ordinary environment can be improved. Further, an arrangement further including a white pixel that generates an image signal in accordance with white light is possible.

Thus, according to the fifth embodiment of the present technology, by using the pixel array section 100 including the pixel 150 in which the SPAD 112 is placed, the sensitivity of the imaging device 10 can be improved.

Modification Example

Although in the fifth embodiment described above the pixel array section 100 including pixels of the same size is used, the size of the pixel 150 including a SPAD may be set larger than the size of the pixels 160 to 180 each including an ordinary photodiode. This is because the sensitivity of the pixel 150 including a SPAD can be improved.

Figure 14:
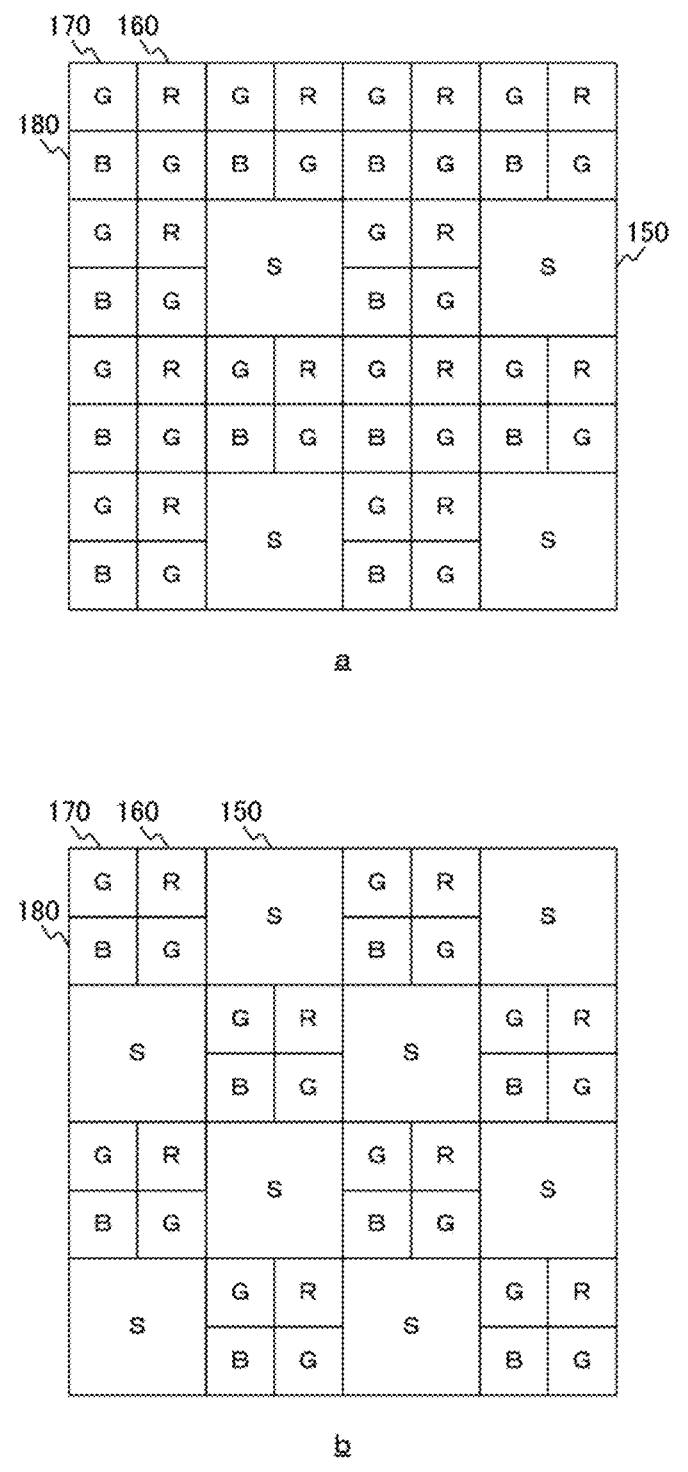

FIG. 14 is a diagram showing examples of the arrangement of pixels in a modification example of the fifth embodiment of the present technology. The drawing shows examples of arrangements in a case where the sizes of the pixel 150 including the SPAD 112 and the pixels 160 to 180 each including an ordinary photodiode are different. "a" in the drawing shows an example in which arrangement is made such that some of the pixels 160 to 180 arranged in the Bayer array form are replaced with pixels 150. The pixel 150 has four times the area of each of the pixels 160 to 180, and therefore the sensitivity in a low-illuminance environment can be further improved. "b" in the drawing shows an example in which pixels 150 are arranged in a checkered form. Since a large number of pixels 150 are arranged, the sensitivity and resolution in a low-illuminance environment can be further improved.

The configuration of the pixel array section 100 other than the above is similar to the configuration of the pixel array section 100 described in the fifth embodiment of the present technology, and therefore a description is omitted.

6. Sixth Embodiment

In the fifth embodiment described above, a SPAD is used for imaging in a low-illuminance environment. In contrast, in a sixth embodiment of the present technology, pupil correction is performed on a pixel including a SPAD. Thereby, a reduction in the sensitivity of the imaging device 10 can be prevented.

[Configuration of Pixel]

Figure 15:
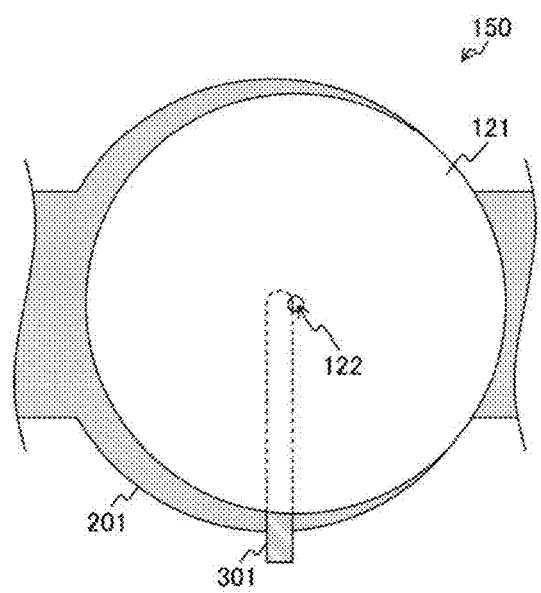
FIG. 15 is a diagram showing an example of a configuration of the pixel 150 in a sixth embodiment of the present technology.

FIG. 15 is a diagram showing an example of the configuration of the pixel 150 in the sixth embodiment of the present technology. The pixel 150 differs from the pixel 110 described in FIG. 3 in that the microlens 121 is placed in a position shifted from the center of the pixel 150. Pupil correction can be performed by thus placing the microlens 121 with a shift from the center of the pixel 150. Here, the pupil correction is the correction of a reduction in the sensitivity of a peripheral portion by setting the position of the microlens 121 of a pixel placed in a peripheral portion among the pixels arranged in the pixel array section 100 to a position shifted in a direction toward a central portion of the pixel array section 100. In a pixel placed in a peripheral portion, light is incident on the microlens 121 from an oblique direction, and consequently the incident light is collected to a position different from the position in a pixel placed in a central portion of the pixel array section 100. In a case where the position of this light collection overlaps with an electrode or the like, a reduction in sensitivity in the pixel placed in a peripheral portion of the pixel array section 100 occurs. The reduction in sensitivity can be prevented by causing light to be collected to a desired position by performing pupil correction.

In the sixth embodiment of the present technology, in the SPAD 112 of the pixel 150 placed in a peripheral portion of the pixel array section 100, light collection of incident light to a portion of the electrode 103 is prevented by performing pupil correction. Thereby, a reduction in detection efficiency can be prevented, and a reduction in sensitivity can be prevented. The pixel 150 of the drawing shows an example of the pixel 150 that is placed in a peripheral portion on the left side in the pixel array section 100 described in FIG. 10, and the microlens 121 is placed in a position shifted toward right with respect to the center of the pixel 150.

The configuration of the pixel array section 100 other than the above is similar to the configuration of the pixel array section 100 described in the fifth embodiment of the present technology, and therefore a description is omitted.

Thus, according to the sixth embodiment of the present technology, by performing pupil correction, a reduction in detection efficiency in the pixel 150 placed in a peripheral portion of the pixel array section 100 can be prevented, and a reduction in the sensitivity of the imaging device 10 can be prevented.

As described above, according to the embodiments of the present technology, while the electrode 103 etc. are placed in a central portion of the SPAD 112, incident light can be collected to the light receiving surface of the SPAD 112 by the light collecting section, and detection efficiency can be improved.

Note that the embodiments described above show examples for embodying the present technology, and matters in the embodiments and matters to define the invention in the claims have respective corresponding relationships. Similarly, matters to define the invention in the claims and matters in the embodiments of the present technology that are given names identical to those of the matters to define the invention in the claims have respective corresponding relationships. However, the present technology is not limited to the embodiments, and may be embodied by making various modifications to embodiments without departing from the spirit of the embodiments.

Further, each of the processing procedures described in the embodiments described above may be grasped as a method having each of these sequences of procedure, and furthermore may be grasped as a program for causing a computer to execute each of these sequences of procedure, or a recording medium that stores the program. As the recording medium, for example, a compact disc (CD), a MiniDisc (MD), a digital versatile disc (DVD), a memory card, a Blu-ray (registered trademark) Disc, and the like may be used.

Note that the effects described in the present specification are only examples and are not limitative ones, and furthermore there may be other effects.

Additionally, the present technology may also be configured as below.

(1)

A solid-state imaging element including:
a photodiode that includes a light receiving surface and an electrode placed on the light receiving surface, and that outputs an electrical signal in accordance with light incident on the light receiving surface in a state where a voltage exceeding a breakdown voltage is applied to the electrode; and
a light collecting section that causes light from a subject to be collected in the light receiving surface other than a region where the electrode is placed.

(2)

The solid-state imaging element according to (1),
in which, in the photodiode, the electrode is placed substantially at a center of the light receiving surface.

(3)

The solid-state imaging element according to (1) or (2),
in which the light collecting section includes a microlens having a concavity in a substantially central portion.

(4)

The solid-state imaging element according to (3),
in which the microlens has an opening in the concavity.

(5)

The solid-state imaging element according to (3) or (4), further including:
wiring that is electrically connected the electrode,
in which the microlens has a concavity continuing along the wiring.

(6)

The solid-state imaging element according to (5),
in which the microlens has a cut in a bottom portion of the continuing concavity.

(7)

The solid-state imaging element according to (1),
in which the light collecting section includes a plurality of microlenses each of which is configured to cause light to be collected in the light receiving surface other than a region where the electrode is placed.

(8)

The solid-state imaging element according to (7), further including:
wiring that is placed between the plurality of microlenses adjacent to each other, and that is electrically connected to the electrode.

(9)

The solid-state imaging element according to (7) or (8),
in which each of the plurality of microlenses has a quadrangular bottom surface.

(10)

The solid-state imaging element according to (1),
in which the light collecting section includes a first light collecting member and a second light collecting member that are sequentially arranged between the electrode and the subject, the second light collecting member having a larger refractive index than the first light collecting member.

(11)

An imaging device including:
a pixel circuit in which pixels each of which includes a photodiode and a light collecting section are arranged in a two-dimensional array form, the photodiode including a light receiving surface and an electrode placed on the light receiving surface, and outputting an electrical signal in accordance with light incident on the light receiving surface in a state where a voltage exceeding a breakdown voltage is applied to the electrode, the light collecting section causing light from a subject to be collected in the light receiving surface other than a region where the electrode is placed; and a processing circuit that processes the output electrical signal.

REFERENCE SIGNS LIST 1 imaging system
10 imaging device
20 distance measuring section
30 infrared light emitting section
100 pixel array section
101 insulating layer
103, 104 electrode
105, 131 first semiconductor region
106 second semiconductor region
107, 132 third semiconductor region
108 guard ring
109 semiconductor substrate
110, 150, 160, 170, 180 pixel
111, 153 resistance
121, 123, 126 microlens
122 opening
124 cut
127 first light collecting member
154 waveform shaping section
155 retention section
156 to 159 MOS transistor
200 power source section
300, 500 signal processing section
301 signal line
400 vertical driving section

What is claimed is:

1. A solid-state imaging element comprising:
a photodiode that includes a light receiving surface and an electrode placed on the light receiving surface, and that outputs an electrical signal in accordance with light incident on the light receiving surface in a state where a voltage exceeding a breakdown voltage is applied to the electrode; and
a light collecting section that causes light from a subject to be collected in the light receiving surface other than a region where the electrode is placed.

2. The solid-state imaging element according to claim 1, wherein, in the photodiode, the electrode is placed substantially at a center of the light receiving surface.

3. The solid-state imaging element according to claim 1, wherein the light collecting section includes a microlens having a concavity in a substantially central portion.

4. The solid-state imaging element according to claim 3, wherein the microlens has an opening in the concavity.

5. The solid-state imaging element according to claim 3, further comprising:
wiring that is electrically connected the electrode,
wherein the microlens has a concavity continuing along the wiring.

6. The solid-state imaging element according to claim 5, wherein the microlens has a cut in a bottom portion of the continuing concavity.

7. The solid-state imaging element according to claim 1, wherein the light collecting section includes a plurality of microlenses each of which is configured to cause light to be collected in the light receiving surface other than a region where the electrode is placed.

8. The solid-state imaging element according to claim 7, further comprising:
wiring that is placed between the plurality of microlenses adjacent to each other, and that is electrically connected to the electrode.

9. The solid-state imaging element according to claim 7, wherein each of the plurality of microlenses has a quadrangular bottom surface.

10. The solid-state imaging element according to claim 1, wherein the light collecting section includes a first light collecting member and a second light collecting member that are sequentially arranged between the electrode and the subject, the second light collecting member having a larger refractive index than the first light collecting member.

11. An imaging device comprising:
a pixel circuit in which pixels each of which includes a photodiode and a light collecting section are arranged in a two-dimensional array form, the photodiode including a light receiving surface and an electrode placed on the light receiving surface, and outputting an electrical signal in accordance with light incident on the light receiving surface in a state where a voltage exceeding a breakdown voltage is applied to the electrode, the light collecting section causing light from a subject to be collected in the light receiving surface other than a region where the electrode is placed; and
a processing circuit that processes the output electrical signal.

* * * * *